United States Patent
Hsieh et al.

(10) Patent No.: US 10,952,325 B2
(45) Date of Patent: Mar. 16, 2021

(54) PRINTED CIRCUIT BOARD STACK STRUCTURE AND METHOD OF FORMING THE SAME

(71) Applicant: Unimicron Technology Corp., Taoyuan (TW)

(72) Inventors: Ching-Ho Hsieh, Taoyuan (TW); Ming-Hsing Wu, Taoyuan (TW); Shang-Wei Chen, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/451,031

(22) Filed: Jun. 25, 2019

(65) Prior Publication Data
US 2020/0329562 A1 Oct. 15, 2020

(30) Foreign Application Priority Data
Apr. 10, 2019 (TW) ................. 108112443

(51) Int. Cl.
| H05K 7/20 | (2006.01) |
| H05K 1/14 | (2006.01) |
| H05K 1/11 | (2006.01) |
| H05K 3/36 | (2006.01) |

(52) U.S. Cl.
CPC ............ *H05K 1/144* (2013.01); *H05K 1/112* (2013.01); *H05K 3/368* (2013.01); *H05K 2201/042* (2013.01); *H05K 2201/10409* (2013.01)

(58) Field of Classification Search
USPC ......................................... 361/803
See application file for complete search history.

(56) References Cited

U.S. PATENT DOCUMENTS

| 4,843,191 A | * | 6/1989 | Thomas | H01L 23/4985 156/297 |
| 2004/0070955 A1 | * | 4/2004 | Dobbs | H05K 1/148 361/752 |
| 2018/0295712 A1 | * | 10/2018 | Heikkinen | H05K 1/112 |

FOREIGN PATENT DOCUMENTS

| JP | 4329251 | 9/2009 |
| TW | I475758 | 3/2015 |
| TW | I619411 | 3/2018 |

OTHER PUBLICATIONS

"Office Action of Taiwan Counterpart Application", dated Mar. 24, 2020, p. 1-p. 7.

* cited by examiner

*Primary Examiner* — Andargie M Aychillhum
(74) *Attorney, Agent, or Firm* — JCIPRNET (57) ABSTRACT

A printed circuit board (PCB) stack structure and method of forming the same are provided. The printed circuit board stack structure includes a first PCB, a second PCB and a connector. The first PCB includes a first pad. The second PCB includes a second pad. The connector has an annular structure, located between the first PCB and the second PCB and electrically connecting the first PCB to the second PCB. The connector includes a substrate, a first conductive elastic piece and a second conductive elastic piece. The substrate has a first surface and a second surface opposite to each other. The first conductive elastic piece is located on the first surface and in electrical contact with the first pad. The second conductive elastic piece is located on the second surface and in electrical contact with the second pad.

20 Claims, 8 Drawing Sheets

PRINTED CIRCUIT BOARD STACK STRUCTURE AND METHOD OF FORMING THE SAME

CROSS-REFERENCE TO RELATED APPLICATION

This application claims the priority benefit of Taiwan application serial no. 108112443, filed on Apr. 10, 2019. The entirety of the above-mentioned patent application is hereby incorporated by reference herein and made a part of this specification.

BACKGROUND

Technical Field

The disclosure relates to a printed circuit board stack structure and method of forming the same.

Description of Related Art

In order to reduce the area occupied by a printed circuit board (PCB) in an electronic product (for example, a mobile phone, a computer, etc.), conventional technology divides the printed circuit board into two pieces, and the two pieces of printed circuit boards are connected to each other through an interposer to form a printed circuit board stack structure. In general, the interposer is a ball grid array (BGA) interposer and has solder balls disposed on opposite surfaces thereof. The printed circuit boards are soldered to the opposite surfaces of the interposer through solder balls via two surface mounting technologies (SMT) processes, so that the printed circuit boards are electrically connected to each other through the interposer. However, in the above SMT processes, due to the multiple times of high temperature reflow process, the integrated circuit (IC) components on the printed circuit boards may be damaged, and warpage and deformation may occur to the printed circuit board because of thermal stress.

On the other hand, it is difficult to separate the printed circuit boards from each other after the PCBs being soldered to the interposer through solder balls, which is disadvantageous for disassembling the stack structure to perform repairing process, if the devices in the printed circuit board stack structure break down and cause the product fail in future.

SUMMARY

The disclosure provides a printed circuit board stack structure and a forming method thereof, the method omits the SMT process, thereby avoiding the issues may be caused by the SMT process. The printed circuit board stack structure of the disclosure is assembled in a separable way, which is advantageous for product rework. The printed circuit board stack structure of the disclosure can be applied to various electronic products such as mobile phones and computers.

The embodiments of the disclosure provide a printed circuit board stack structure including a first printed circuit board, a second printed circuit board, and a connector. The first printed circuit board has a first pad. The second printed circuit board has a second pad. The connector has an annular structure, and is located between the first printed circuit board and the second printed circuit board and electrically connects the first printed circuit board to the second printed circuit board. The connector includes a substrate, a first conductive elastic piece and a second conductive elastic piece. The substrate has a first surface and a second surface opposite to each other. The first conductive elastic piece is on the first surface and in electrical contact with the first pad. The second conductive elastic piece is on the second surface and in electrical contact with the second pad.

The embodiments of the disclosure provide a method of forming a printed circuit board stack structure including the following steps. A first printed circuit board and a second printed circuit board are provided, the first printed circuit board includes a first pad, and the second printed circuit board includes a second pad. A connector is provided and the connector is placed between the first printed circuit board and the second printed circuit board. The connector has an annular structure and includes a substrate, a first conductive elastic piece and a second conductive elastic piece. The substrate has a first surface and a second surface opposite to each other. The first conductive elastic piece is located on the first surface and has a first fixed portion and a first free portion. The second conductive elastic piece is located on the second surface and has a second fixed portion and a second free portion. The first conductive elastic piece and the second conductive elastic piece are electrically connected to each other. And the first printed circuit board, the connector and the second printed circuit board are locked together by a detachable locking component, such that the first conductive elastic piece is in electrical contact with the first pad, and the second conductive elastic piece is in electrical contact with the second pad.

Based on the above, in the disclosure, different printed circuit boards are electrically connected to each other by a connector having conductive elastic pieces, and the printed circuit boards and the connector are locked and secured together using a detachable locking component. In this way, compared to the conventional method of using the BGA/BGA interposer to solder and electrically connect the printed circuit boards, at least two SMT processes are omitted in the disclosure, and the damage of the components or warpage and deformation of the printed circuit board may be caused by the high-temperature of reflow furnace are avoided. In addition, since the printed circuit boards and the connector of the disclosure are assembled in a separable way using detachable locking components, the printed circuit board stack structure can be easily disassembled for reparation if the components in the printed circuit board stack structure fail.

To make the above features and advantages of the disclosure more comprehensible, several embodiments accompanied with drawings are described in detail as follows.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A and FIG. 3B to FIG. 4A and FIG. 4B are schematic cross-sectional views illustrating the formation of a printed circuit board stack structure, in accordance with some embodiments of the disclosure, wherein

DESCRIPTION OF THE EMBODIMENTS

The invention will be more fully described with reference to the drawings of the embodiments. However, the invention may be embodied in a variety of different forms and should not be limited to the embodiments described herein. The same or similar component numbers indicate the same or similar components. Accordingly, no further description thereof is provided hereinafter.

Figure 1:
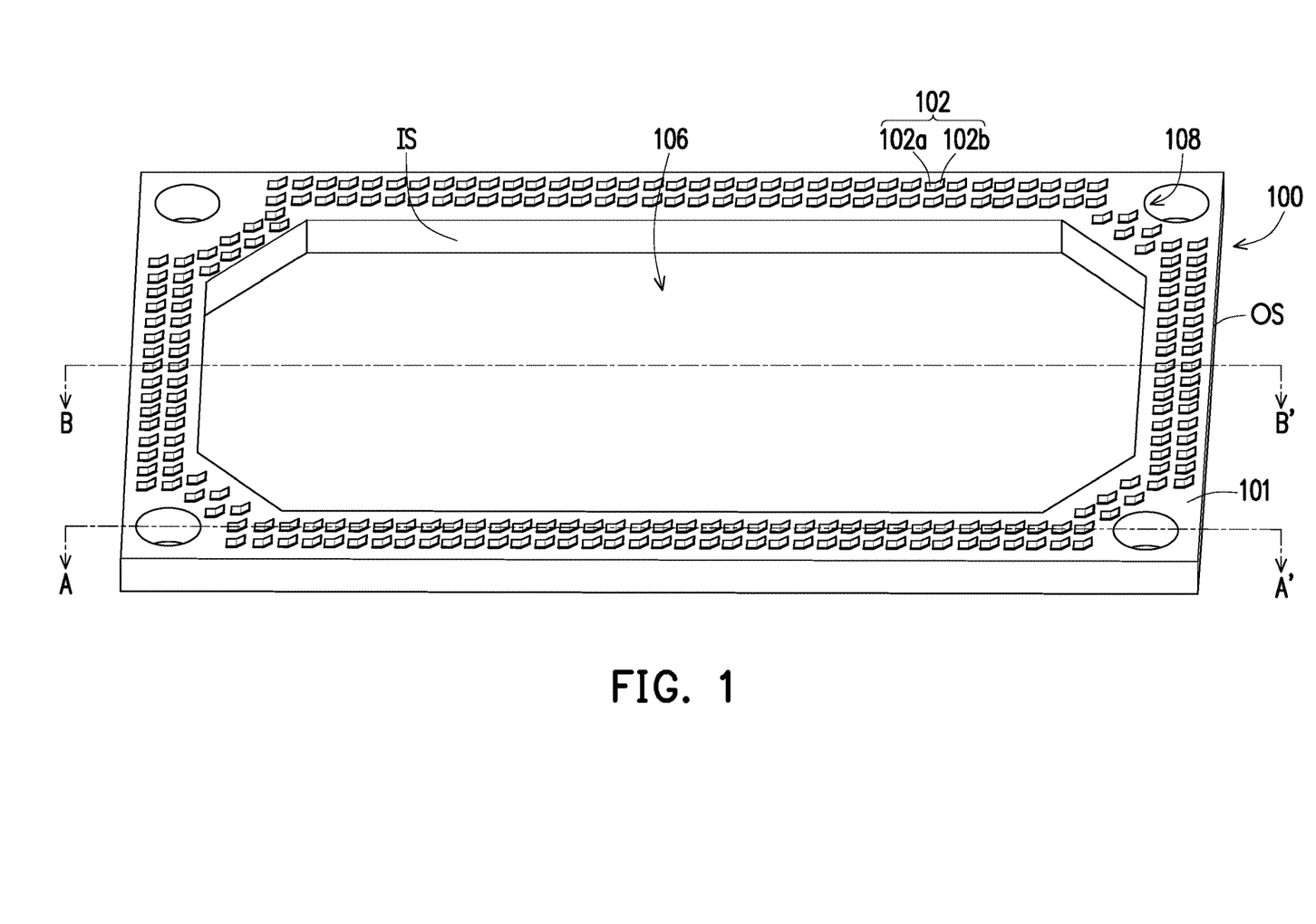
FIG. 1 illustrates a perspective view of a connector.
Figure 2:
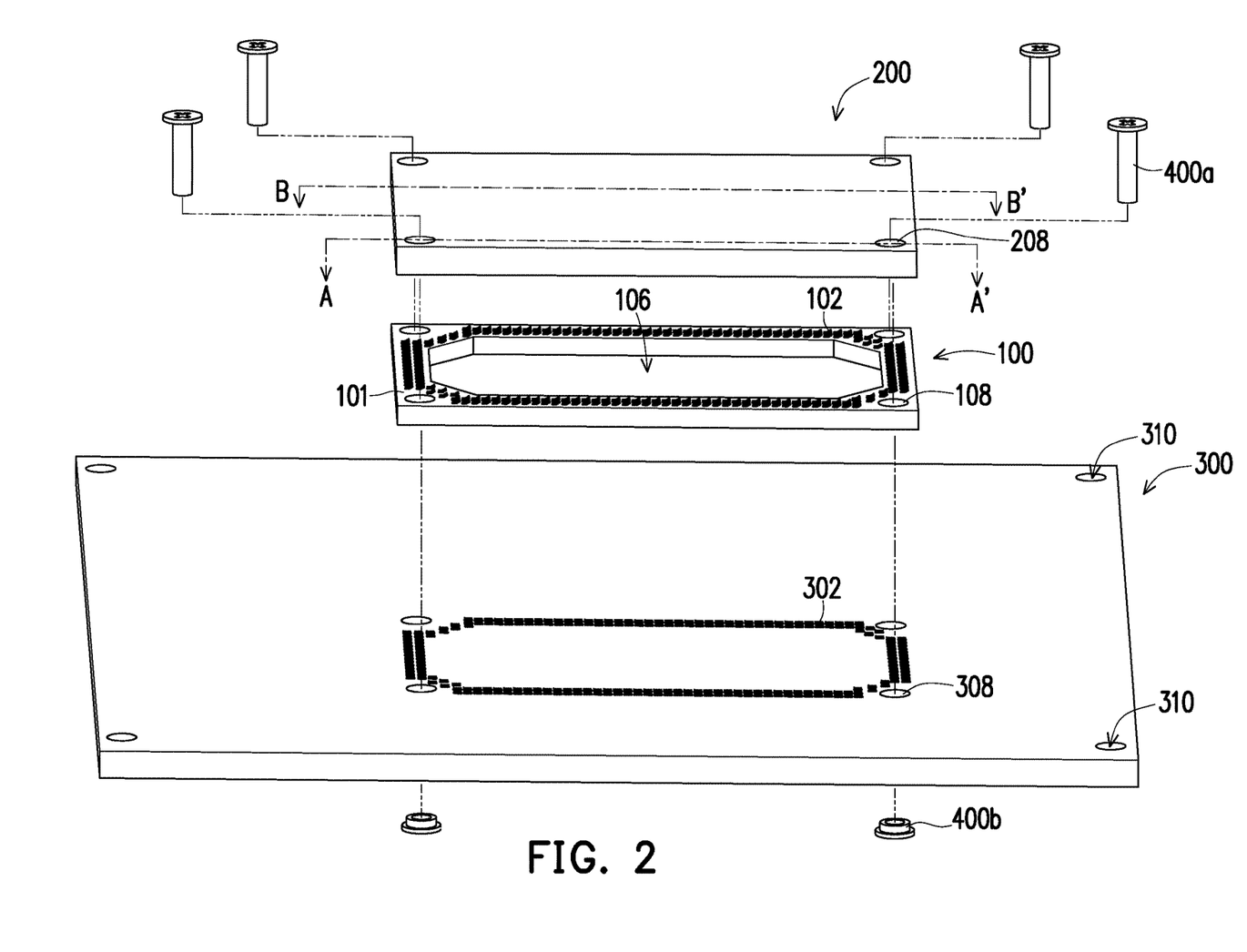
FIG. 2 is an exploded perspective view of a connector between printed circuit boards (PCBs) in accordance with some embodiments of the disclosure.
Figure 3A:
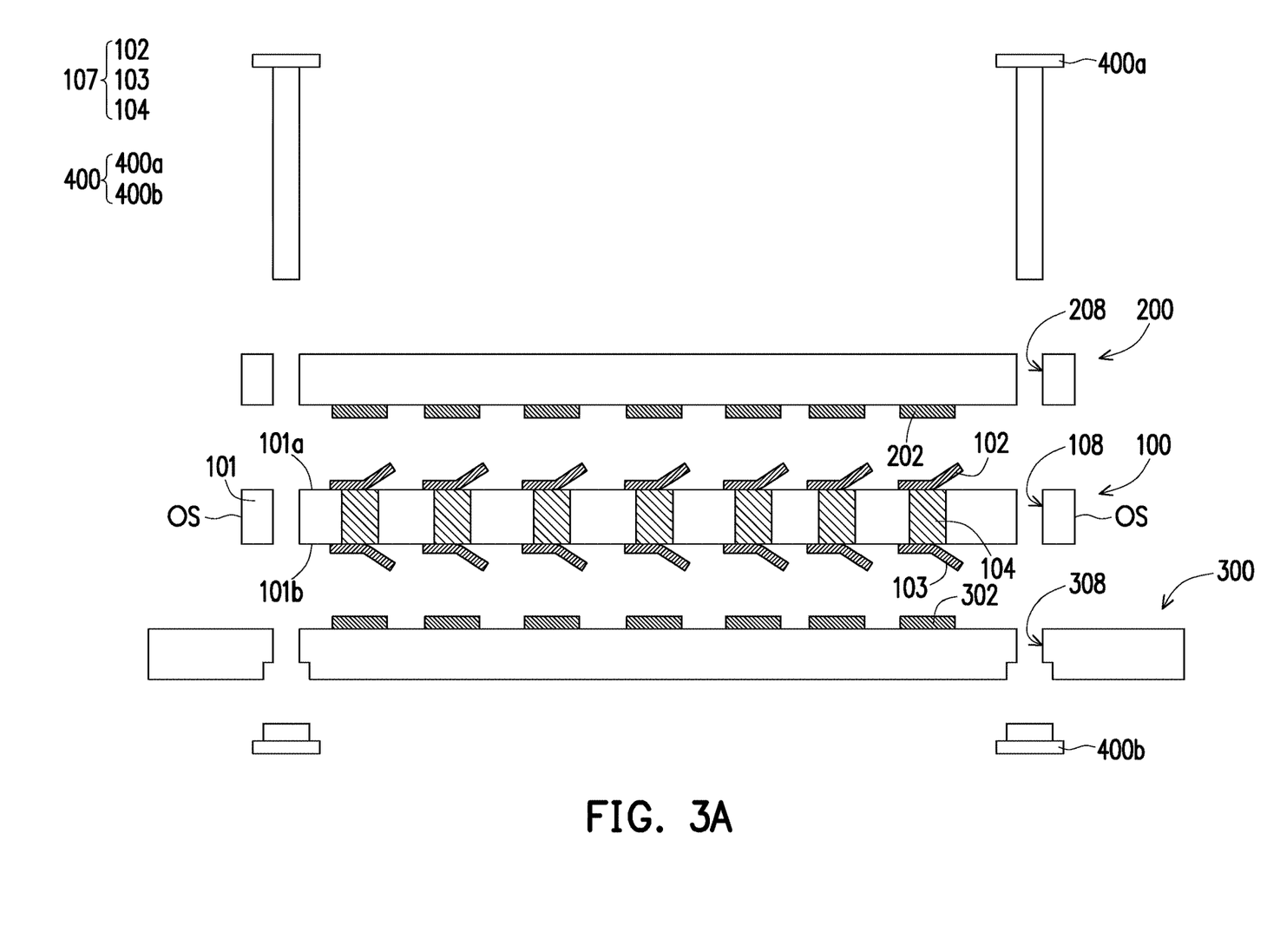
FIG. 3A is a cross-sectional view taken along line A-A' of FIG. 2.
Figure 3B:
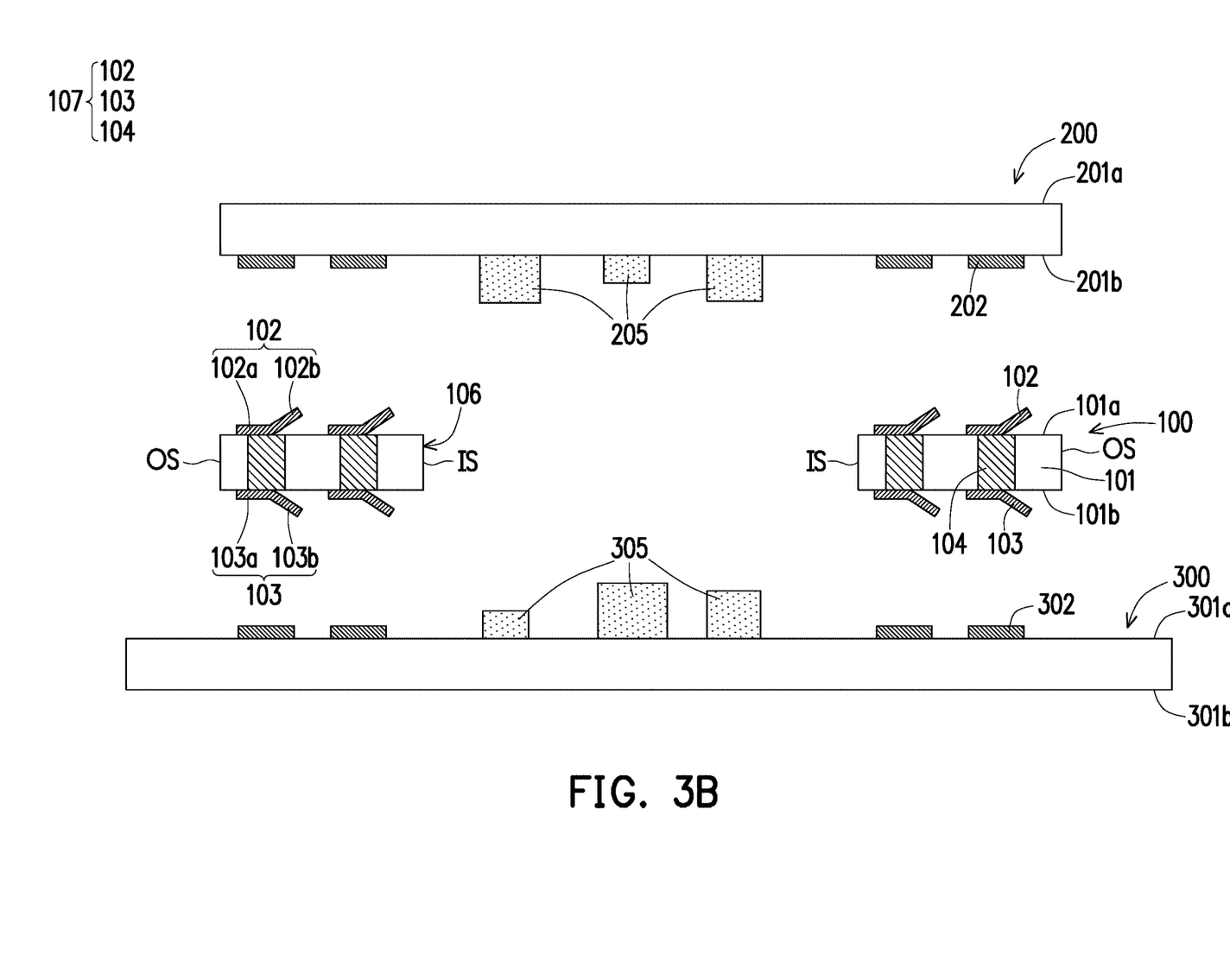
FIG. 3B is a cross-sectional view taken along line B-B' of FIG. 2.

FIG. 1 illustrates a perspective view of a connector. FIG. 2 illustrates an exploded perspective view of a connector between printed circuit boards. FIG. 3A illustrates a cross-sectional view taken along line A-A' of FIG. 2. FIG. 3B illustrates a cross-sectional view taken along line B-B' of FIG. 2.

Referring to FIG. 1 and FIG. 2, a connector 100 is provided. In some embodiments, the connector 100 is configured as an annular structure, and has an annular region (or referred to as a hollow region) 106 surrounded by the inner sidewall IS of the connector 100. The connector 100 is placed between the printed circuit board 200 and the printed circuit board 300. In some embodiments, the connector 100 has the same or similar outer profile as the printed circuit board 200 located thereon, but the disclosure is not limited thereto. In alternate embodiments, the connector 100 may also have a different profile than the printed circuit board 200. The printed circuit board 200 and the printed circuit board 300 may have the same or different sizes. In some embodiments, the size (e.g., width, length, area, etc.) of the printed circuit board 200 is less than the size of the printed circuit board 300, and the size of the connector 100 may be less than, equal to, or slightly larger than the size of the printed circuit board 200.

For example, the shapes of the printed circuit board 200 and the printed circuit board 300 may be square, rectangular, polygonal, or other irregular shapes, respectively. The printed circuit board 200 and the printed circuit board 300 may have any suitable shape depending on the design and requirement of the product, respectively. The connector 100 may have any suitable annular structure, such as a square ring, a circular ring, an elliptical ring, or an irregular annular structure. The shape and size of the connector 100 is related to the shape and size of the printed circuit board 200 having a smaller size in the PCB stack structure.

In some embodiments, the printed circuit board 300, the connector 100, and the printed circuit board 200 are placed in sequence from bottom to top. The orthographic projections of the printed circuit board 200 and the connector 100 on a horizontal plane (at which the top surface of the printed circuit board 300 is located) are within the printed circuit board 300 and overlapped with each other. In some embodiments, the orthographic projection of the connector 100 on the top surface of the printed circuit board 300 is within the orthographic projected area of the printed circuit board 200 on the top surface of the printed circuit board 300.

Referring to FIG. 2, FIG. 3A and FIG. 3B, in some embodiments, the connector 100 includes a substrate 101, conductive terminals 102, conductive terminals 103, and through vias 104. The substrate 101 is an insulating substrate, such as an FR4 substrate, but the disclosure is not limited thereto. The substrate 101 has a first surface (such as upper surface) 101a and a second surface (such as lower surface) 101b opposite to each other. The conductive terminals 102 and the conductive terminals 103 are respectively disposed on the first surface 101a and the second surface 101b of the substrate 101, and are electrically connected to each other by the through vias 104. The conductive terminals 102 and 103 include conductive materials such as metals or metal alloys. For example, the conductive terminals 102 and 103 may include copper, copper alloys, or the like. In some embodiments, the connector 100 is a land grid array (LGA) connector (or referred to as LGA/LGA connector), but the disclosure is not limited thereto.

In some embodiments, the conductive terminals 102 and 103 include conductive elastic pieces or conductive elastic fringes. Referring to the enlarged view of a portion of the connector 100 shown in FIG. 5A and FIG. 5B at the same time, for example, the conductive terminal 102 includes a fixed portion 102a and a free portion 102b connected to each other. The fixed portion 102a is fixed on the first surface 101a of the substrate 101, and is in contact with the through via 104 and/or the first surface 101a of the substrate 101. The free portion 102b overhangs the first surface 101a of the substrate 101 and is not in contact with the first surface 101a. The conductive terminal 103 includes a fixed portion 103a and a free portion 103b connected to each other. The fixed portion 103a is fixed on the second surface 101b of the substrate 101, and is in contact with the through via 104 and/or the second surface 101b of the substrate 101. The free portion 103b hangs below the second surface 101b of the substrate 101, and is not in contact with the second surface 101b.

Figure 5A:
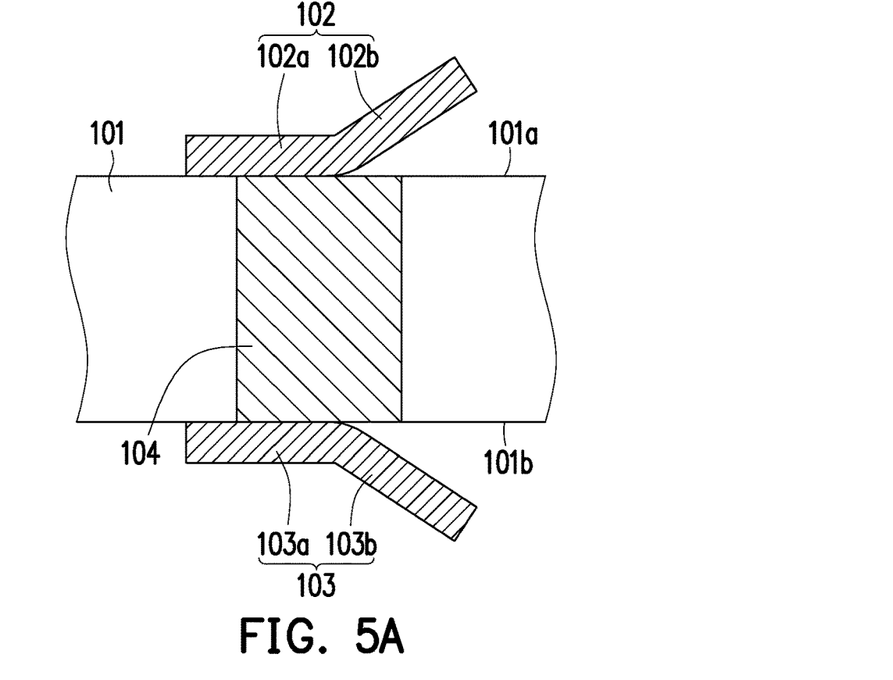
FIG. 5A and FIG. 5B illustrate enlarged views of a portion of a connector in accordance with some embodiments of the disclosure, respectively.
Figure 5B:
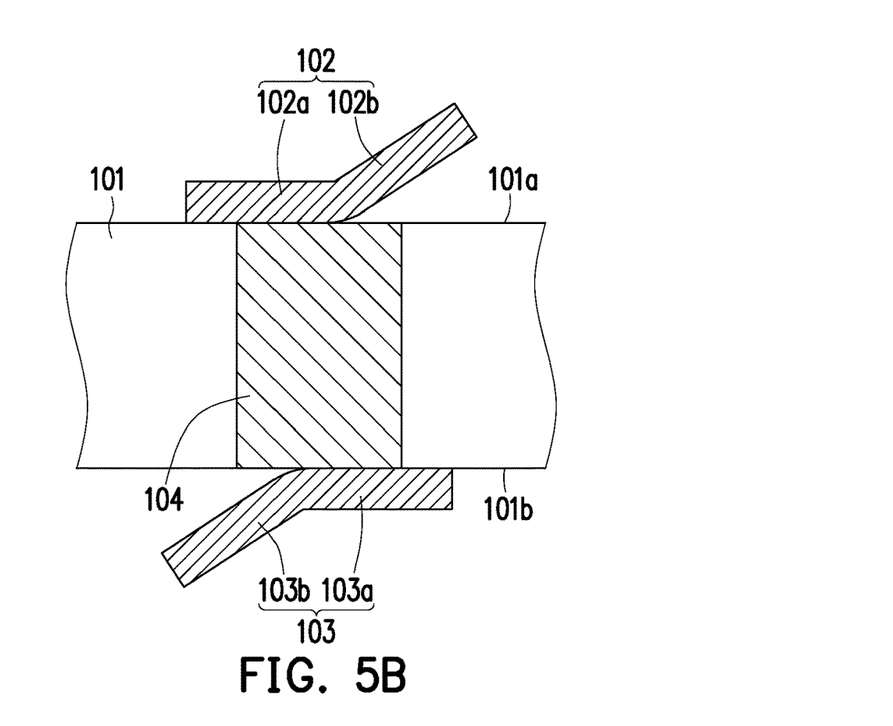

In some embodiments, for example, as shown in FIG. 5A, the conductive terminal 102 and the conductive terminal 103 are symmetrically disposed with respect to the substrate 101, the free portion 102b of the conductive terminal 102 and the free portion 103b of the conductive terminal 103 are extending toward the same direction. In some other embodiments, for example, as shown in FIG. 5B, the conductive terminal 102 and the conductive terminal 103 are asymmetrically disposed with respect to the substrate 101, the free portion 102b of the conductive terminal 102 and the free portion 103b of the conductive terminal 103 extending toward different directions, such as opposite directions. The projections of the conductive terminal 102 and the conductive terminal 103 on the first surface 101a or the second surface 101b of the substrate 101 may be overlapped (such as, completely overlapped or partially overlapped) with each other.

Still referring to FIG. 2, FIG. 3A and FIG. 3B, the through via 104 is located in the substrate 101 and between the conductive terminal 102 and the conductive terminal 103. In some embodiments, the top surface of the through via 104 is substantially level with the first surface 101a of the substrate 101, and the bottom surface of the through via 104 is substantially level with the second surface 101b of the substrate 101. The through via 104 penetrates through the substrate 101 to electrically connect the conductive terminal 102 and the conductive terminal 103 on the opposite surfaces of the substrate 101. The through via 104 includes a conductive material such as a metal or a metal alloy. For example, the through via 104 may include copper, a copper alloy, or the like.

In some embodiments, each through via 104 connects a pair of conductive terminals 102 and 103 which are corresponding to each other. The pair of conductive terminals 102 and 103 and the through via 104 therebetween constitute a connector unit 107. In other words, the connector 100 includes a plurality of connector units 107. In some embodiments, the plurality of connector units 107 are spaced from each other and electrically isolated from each other. The plurality of connector units 107 may include connector unit(s) for electrically connecting the printed circuit boards 200 and 300 for transmitting signals, ground connector unit(s), and/or dummy connector unit(s), but the disclosure is not limited thereto.

The printed circuit board 200 is disposed over the first surface 101a of the connector 100. The sidewalls of the printed circuit board 200 may be aligned or not aligned with the outer sidewalls OS of the connector 100. The printed circuit board 200 includes pads 202 corresponding to at least a portion of the conductive terminals 102. The pad 202 includes a conductive material such as a metal or a metal alloy. For example, the pad 202 may include copper, aluminum, alloys thereof, or the like. In some embodiments, as shown in FIG. 3B, the printed circuit board 200 includes a plurality of devices 205, and the devices 205 may include active devices, passive devices, or combinations thereof. The active devices include, for example, integrated circuit (IC) chips, diodes, or the like. The passive devices include, for example, capacitors, resistors, inductors, or the like. The sizes of the plurality of devices 205 may be the same as or different from each other. In some embodiments, the devices 205 are disposed on the lower surface 201b of the printed circuit board 200 opposite to the upper surface 101a of the connector 100, and are located at the corresponding location directly above the annular region 106 enclosed by the inner sidewalls IS of the connector 100. In some embodiments, the device 205 is electrically connected to the printed circuit board 200 by solder balls (not shown), for example. Although the devices 205 are shown as being disposed on the lower surface 201b of the printed circuit board 200, the disclosure is not limited thereto. Depending on the requirements and design of the product, various devices may be disposed at any suitable location on the upper surface 201a, or the lower surface 201b or both the upper surface 201a and the lower surface 201b of the printed circuit board 200.

The printed circuit board 300 is located below the lower surface 101b of the connector 100 and has pads 302 corresponding to at least a portion of the conductive terminals 103. The pad 302 includes a conductive material such as a metal or a metal alloy. For example, the pad 302 may include copper, aluminum, alloys thereof, or the like. In some embodiments, as shown in FIG. 3B, the printed circuit board 300 includes a plurality of devices 305, and the devices 305 may include active devices, passive devices, or combinations thereof. The active devices include, for example, IC chips, diodes, or the like. The passive devices include, for example, capacitors, resistors, inductors, or the like. The sizes of the plurality of devices 305 may be the same as or different from each other. In some embodiments, the devices 305 are disposed on the upper surface 301a of the printed circuit board 300 opposite to the lower surface 101b of the connector 100 and at a corresponding location directly below the annular region 106 of the connector 100. In some embodiments, the devices 305 are electrically connected to the printed circuit board 300 through solder balls, for example. Although the devices 305 are shown as being disposed at a position corresponding to the annular region 106, on the upper surface 301a of the printed circuit board 300, the disclosure is not limited thereto. Depending on the requirements and design of the product, various devices may be disposed at any suitable locations one the upper surface 301a (e.g., other locations such as corresponding positions outside the outer sidewall OS of the connector 100), the lower surface 301b, or both the upper surface 301a and the lower surface 301b of the printed circuit board 300.

In some embodiments, the height of the connector 100 may be adjusted according to the heights of the devices 205 and 305 of the printed circuit boards 200 and 300 disposed at the corresponding locations of the annular regions 106 of the connector 100, to avoid the devices 205 and 305 to contact with each other.

Referring to FIG. 2 and FIG. 3A, in some embodiments, the printed circuit board 200, the connector 100, and the printed circuit board 300 respectively have openings 208, openings 108, and openings 308. The openings 208, the openings 108 and the openings 308 are aligned with each other. In some embodiments, the openings 208 are disposed at corners of the printed circuit board 200 and penetrate through the printed circuit board 200. The openings 108 are disposed at corners of the connector 100 and penetrate through the connector 100. The openings 308 are disposed at the positions of the printed circuit board 300 corresponding to the openings 208 and 108, and penetrate through the printed circuit board 300. In some embodiments, the openings 108, 208, 308 have smooth inner walls. In alternative embodiments, the openings 108, 208, 308 are screw holes for screw-locking, respectively, and the inner walls thereof have screw threads corresponding to the threads of screws, but the disclosure is not limited thereto.

Referring to FIG. 3A and FIG. 3B to FIG. 4A and FIG. 4B, the printed circuit board 200, the connector 100, and the printed circuit board 300 are locked together by detachable locking components. The detachable locking components may be screw elements, engaging elements, or the like. For example, the printed circuit board 200, the connector 100, and the printed circuit board 300 are connected and fixed together by screw elements 400 in a screw-locking manner, so as to form a printed circuit board stack structure 500. The screw element 400 includes, for example, a screw bolt 400a and a screw nut 400b. The screw bolt 400a and the screw nut 400b have screw threads corresponding to each other. For example, the openings 208, 108, 308 of the printed circuit board 200, the connector 100, and the printed circuit board 300 are aligned with each other, and the screw bolt 400a is placed over the opening 208 of the printed circuit board 200, and the screw nut 400b is placed below the bottom of the opening 308 of the printed circuit board 300. Thereafter, the screw bolt 400a is passed through the opening 208 of the printed circuit board 200, the opening 108 of the connector 100, and the opening 308 of the printed circuit board 300, and the screw bolt 400a and the screw nut 400b are locked to each other, such that the printed circuit board 200, the connector 100 and the printed circuit board 300 are locked together, and the printed circuit board 200 and the printed circuit board 300 are electrically connected to each other by the connector 100.

Figure 4A:
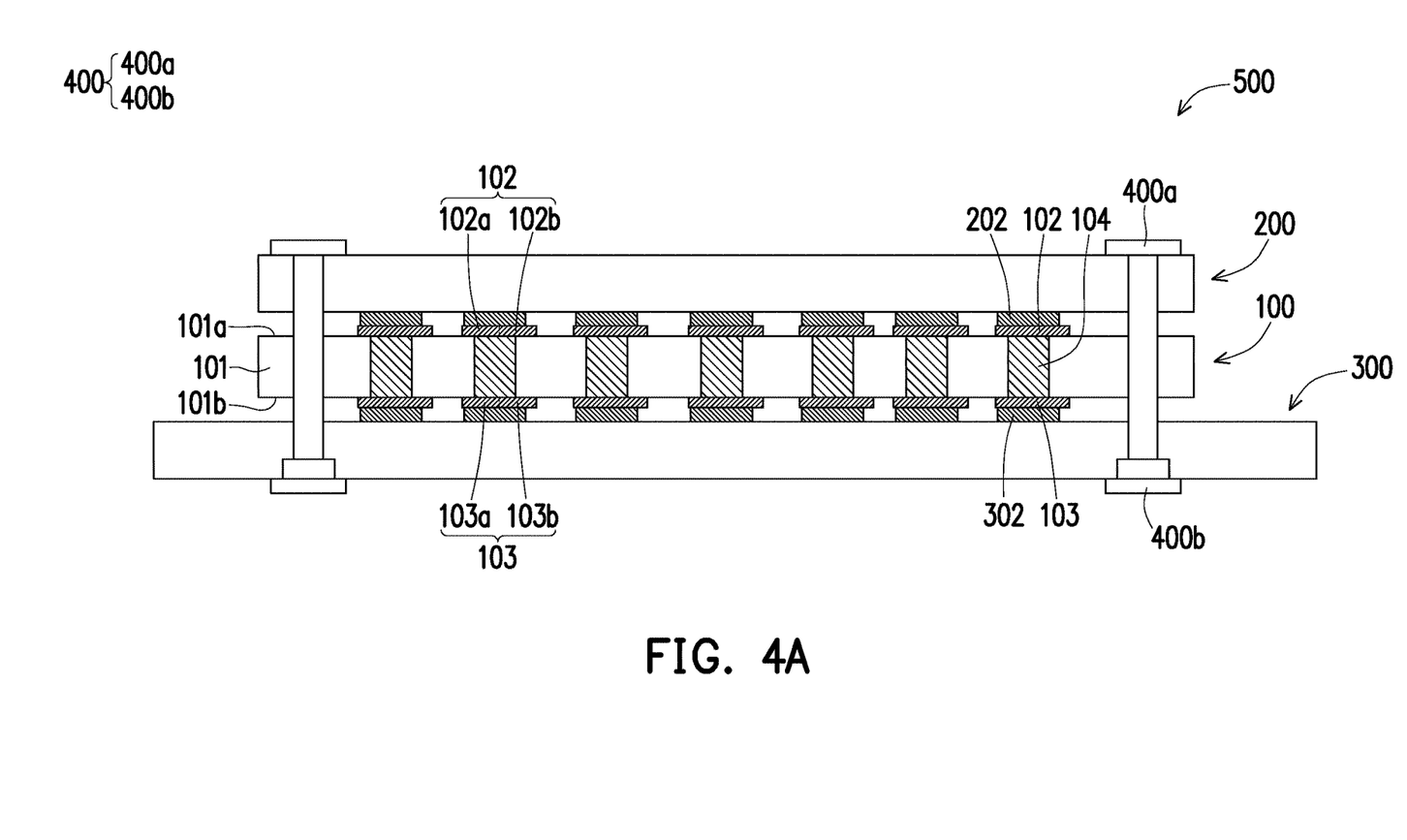
Figure 4B:
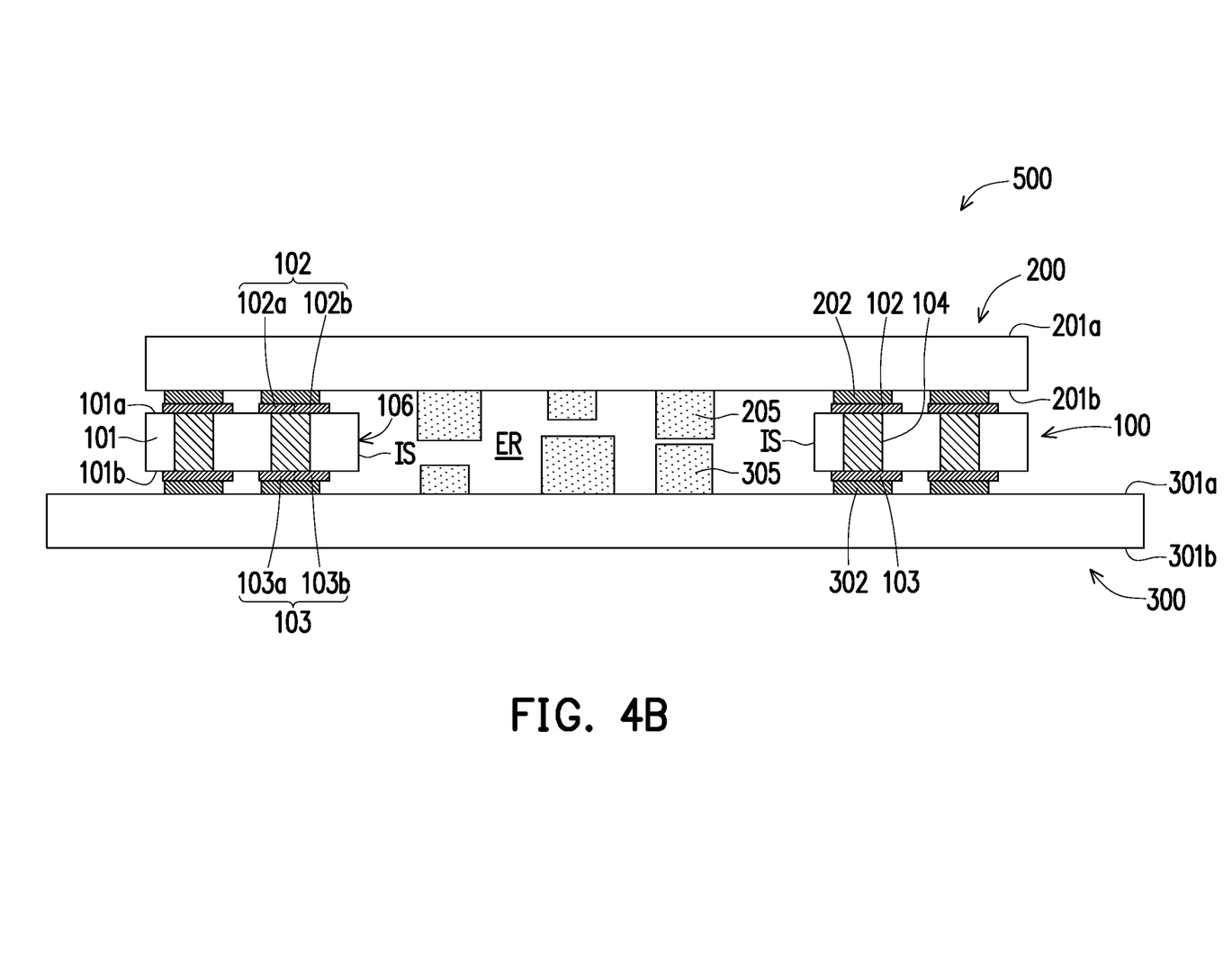

Referring to FIG. 4A and FIG. 4B, the printed circuit board stack structure 500 includes the printed circuit board 200, the printed circuit board 300, the connector 100, and the screw element 400. The printed circuit boards 200 and 300 and the connector 100 are locked by the screw elements 400. The printed circuit board 200 and the printed circuit board 300 are electrically connected to each other by the connector 100. In some embodiments, in the printed circuit board stack structure 500 in a state where the screw element 400 is locked, the free portion 102b of the conductive terminal 102 is pressed to be close to and in contact with the upper surface 101a of the substrate 101 and the top surface of the through via 104 of the connector 100, and the free portion 103b of the conductive terminal 103 is pressed to be close to and in contact with the lower surface 101b of the substrate 101 and the bottom surface of the through via 104 of the connector 100. In some other embodiments, in the printed circuit board stack structure 500 in the state where the screw element 400 is locked, the free portion 102b of the conductive terminal 102 is pressed to be close to, but not in contact with, or in partial contact with the upper surface 101a of the substrate 101 and the top surface of the through via 104 of the connector 100, and the free portion 103b of the conductive terminal 103 is pressed to be close to, but not in contact with, or in partial contact with the lower surface 101b of the substrate 101 and the bottom surface of the through via 104 of the connector 100. Although FIG. 4A and FIG. 4B illustrate that the entire free portions 102b and 103b of the conductive terminals 102 and 103 of the connector 100 are pressed to completely contact the surface of the substrate 101 and the through via 104 of the connector 100, the disclosure is not limited thereto. Depending on the requirements and design of the product, the free portions 102b and 103b of the conductive terminals 102 and 103 may be in full contact, partial contact or non-contact with the substrate 101 and/or the through via 104, respectively, in the state where the screw element 400 is locked. The pads 202 of the printed circuit board 200 are in contact with the conductive terminals 102 of the connector 100, and the pads 302 of the printed circuit board 300 are in contact with the conductive terminals 103 of the connector 100, such that the pads 202 of the printed circuit board 200 and the pads 302 of the printed circuit board 300 are electrically connected to each other by the conductive terminals 102, the through vias 104, and the conductive terminals 103 of the connector 100. Although the figures illustrate that one pad of the printed circuit board is connected to one corresponding conductive terminal of the connector, the disclosure is not limited thereto. Depending on the requirements and design of the product, one pad of the printed circuit board may be connected to a plurality of corresponding conductive terminals of the connector, or a plurality of pads of the printed circuit board may be connected to the same one corresponding conductive terminal of the connector.

Referring to FIG. 4B, an enclosed space ER is enclosed by the lower surface 201b of the printed circuit board 200, the upper surface 301a of the printed circuit board 300, the inner sidewalls IS of the substrate 101 of the connector 100, and the sidewalls of the a portion of the conductive terminals 102, 103 and a portion of the pads 202, 302. Herein, an enclosed space includes a completely sealed space or an enclosed space which is not completely sealed. The devices 205 of the printed circuit board 200 and the devices 305 of the printed circuit board 300 are located in the enclosed space ER. In other words, at least portions of the devices 205 and the devices 305 are located within the annular region 106 of the connector 100 and are laterally surrounded by the connector 100. In some embodiments, the height of the connector 100 is configured such that the device 205 and the device 305 are not in contact with each other with a gap therebetween.

Referring to FIG. 2, FIG. 4A and FIG. 4B, in some embodiments, the printed circuit board 300 further includes openings 310. The openings 310 are located at the area outside the connector 100, for example, corners of the printed circuit board 300, but not limited thereto. Screw elements may be used to pass through the openings 310 to lock the printed circuit board stack structure 500 to other electronic devices.

Figure 6:
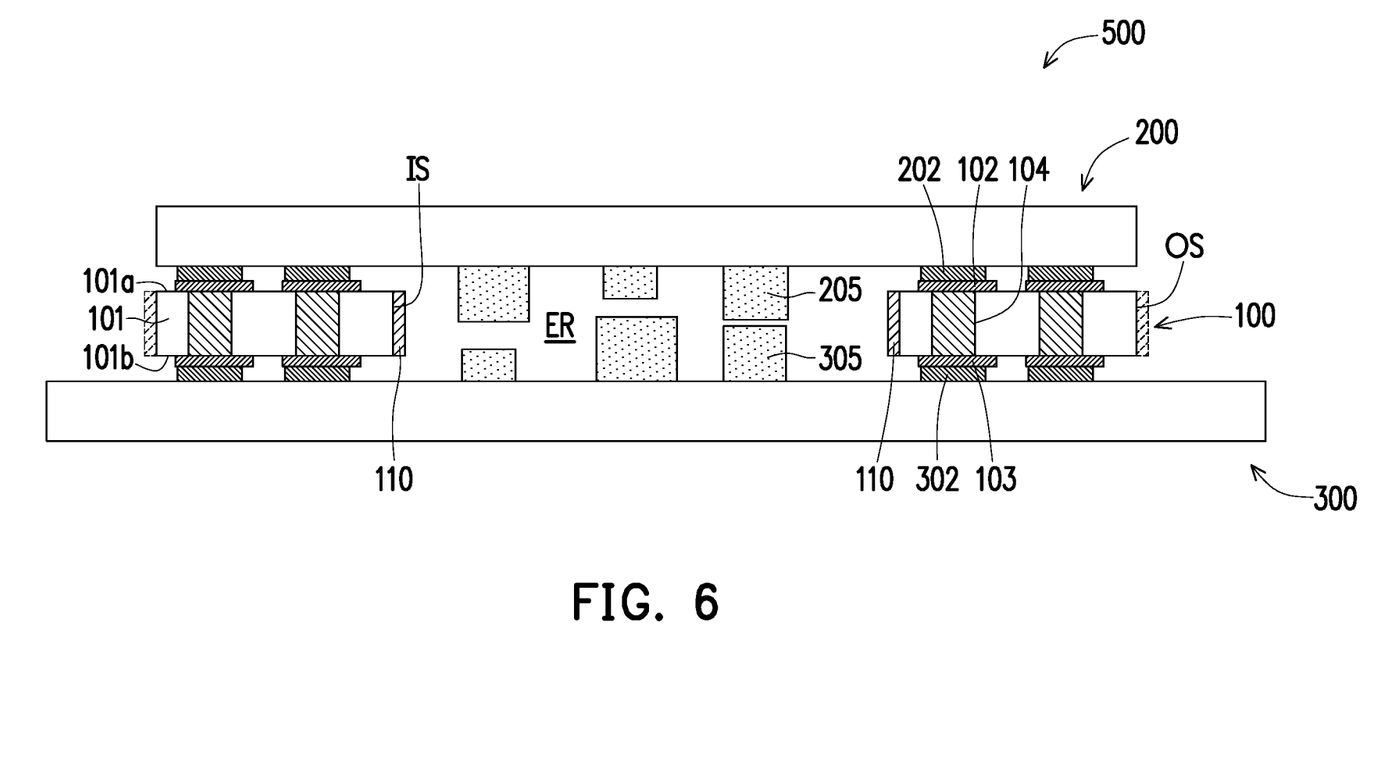
FIG. 6 illustrates a schematic cross-sectional view of a printed circuit board stack structure in accordance with some embodiments of the disclosure.

Referring to FIG. 6, in some embodiments, the printed circuit board stack structure 500 further includes a conductor layer 110 disposed on the inner sidewall IS of the substrate 101 of the connector 100 for shielding electromagnetic interference (EMI). The conductor layer 110 includes a metal such as copper or other suitable metal. The conductor layer 110 is formed on the inner sidewall IS of the substrate 101 of the connector 100 by electroplating, for example. The conductor layer 110 is electrically isolated from other components of the connector 100. In some embodiments, since the devices 205 and 305 are disposed within the enclosed space ER and the conductor layer 110 is disposed on the inner sidewall IS of the connector 100, electromagnetic interference (EMI) generated by the devices 205 and 305 can be shielded. In some embodiments, the conductor layer 110 is merely disposed on the inner sidewall IS of the connector 100, but the disclosure is not limited thereto. Depending on the design and requirements of the product, the conductor layer 110 may be disposed on the inner sidewall IS, the outer sidewall OS, or both the inner sidewall IS and the outer sidewall OS of the substrate 100 of the connector 100. Through disposing the conductor layer on the sidewall of the substrate 100 of the connector 100, the number of the ground connectors in the connector 100 may be reduced, and a metal cap for EMI shielding is not required, thereby saving space and cost.

In the embodiments of the disclosure, if a part of the components in the printed circuit board stack structure 500 fails, the screw element 400 can be easily disassembled to separate the printed circuit board 200, the connector 100, and the printed circuit board 300, thereby making it easy to repair for the specific failed components. In some embodiments, after the repair is completed, the printed circuit board 200, the connector 100, and the printed circuit board 300 may be relocked together by the screw element 400.

In view of above, in the disclosure, different printed circuit boards are electrically connected to each other by the connector having conductive elastic pieces, the printed circuit boards and the connector are locked together using a detachable locking element. In this way, compared to the conventional method of using the BGA/BGA interposer to solder and connect the printed circuit boards, the disclosure omits the SMT process, and the damage of the components soldered on the printed circuit board or warpage and deformation of the printed circuit board may be caused the high-temperature of reflow furnace are avoided. In addition, since the printed circuit board and the connector of the disclosure are assembled in a separable way using detachable locking components, the printed circuit board stack structure can be easily disassembled for repairing if the devices in the printed circuit board stack structure fail, especially the devices in the above-mentioned enclosed space.

Although the disclosure has been described with reference to the above embodiments, the disclosure is not limited to the embodiments, it will be apparent to one of ordinary skill in the art that modifications to the described embodiments may be made without departing from the spirit of the disclosure. Accordingly, the scope of the disclosure is defined by the attached claims.

What is claimed is:

1. A printed circuit board stack structure, comprising:
a first printed circuit board, having a first pad disposed on a bottom surface of the first printed circuit board;
a second printed circuit board, having a second pad disposed on a top surface of the second printed circuit board; and
a connector, having an annular structure, located between the first printed circuit board and the second printed circuit board, and electrically connecting the first printed circuit board to the second printed circuit board, the connector comprises:
a substrate having a first surface and a second surface opposite to each other;
a first conductive elastic piece on the first surface and in electrical contact with the first pad; and
a second conductive elastic piece on the second surface and in electrical contact with the second pad,
wherein an orthographic projection of the first printed circuit board and an orthographic projection of the connector on a horizontal plane at which the top surface of the second printed circuit board is located are within the second printed circuit board and overlapped with each other; and
wherein the first surface of the substrate is facing the bottom surface of the first printed circuit board, and a first gap is existed between the first surface of the substrate and the bottom surface of the first printed circuit board, the second surface of the substrate is facing the top surface of the second printed circuit board, and a second gap is existed between the second surface of the substrate and the top surface of the second printed circuit board.

2. The printed circuit board stack structure of claim 1, further comprising a detachable locking component, wherein the first printed circuit board, the connector and the second printed circuit board are locked together by the detachable locking component.

3. The printed circuit board stack structure of claim 2, wherein the detachable locking component comprises a screw element.

4. The printed circuit board stack structure of claim 1, wherein the first conductive elastic piece comprises a first fixed portion and a first free portion connected to each other, the second conductive elastic piece comprises a second fixed portion and a second free portion connected to each other.

5. The printed circuit board stack structure of claim 1, wherein the connector further comprises a through via located in the substrate and penetrating through the substrate, so as to electrically connect the first conductive elastic piece to the second conductive elastic piece, wherein a top surface of the through via is level with the first surface of the substrate, and a bottom surface of the through via is level with the second surface of the substrate.

6. The printed circuit board stack structure of claim 1, wherein an enclosed space is enclosed by an inner sidewall of the connector, at least a portion of the bottom surface of the first printed circuit board and a portion of the top surface of the second printed circuit board.

7. The printed circuit board stack structure of claim 6, wherein the first printed circuit board further comprises a first device disposed on the at least the portion of the bottom surface of the first printed circuit board, the first device is located in the enclosed space and laterally surrounded by the connector.

8. The printed circuit board stack structure of claim 6, wherein the second printed circuit board further comprises a second device disposed on the portion of the top surface of the second printed circuit board, the second device is located in the enclosed space and laterally surrounded by the connector.

9. The printed circuit board stack structure of claim 6, wherein the connector further comprises a conductor layer disposed on the inner sidewall, or the outer sidewall, or both the inner sidewall and the outer sidewall of the substrate of the connector.

10. The printed circuit board stack structure of claim 1, wherein the connector has a profile similar to the profile of the first printed circuit board.

11. The printed circuit board stack structure of claim 1, wherein the first pad comprises one first pad, and the first conductive elastic piece comprises a plurality of first conductive elastic pieces, and the one first pad is in electrical contact with the plurality of first conductive elastic pieces.

12. The printed circuit board stack structure of claim 1, wherein the first pad comprises a plurality of first pads, the first conductive elastic piece comprises one first conductive elastic piece, and the plurality of first pads are in electrical contact with the one first conductive elastic piece.

13. The printed circuit board stack structure of claim 1, wherein the second printed circuit board further comprises an opening located at an area outside the connector.

14. The method of forming the printed circuit board stack structure of claim 13, wherein
before the locking, the first free portion of the first conductive elastic piece hangs over the first surface, and the second free portion of the second conductive elastic piece hangs below the second surface; and
after the locking, the first free portion of the first conductive elastic piece is pressed to be close to the first surface, and the second free portion of the second conductive elastic piece is pressed to be close to the second surface.

15. The method of forming the printed circuit board stack structure of claim 14, further comprising forming a conductor layer on the inner sidewall, or the outer sidewall, or on both the inner sidewall and the outer sidewall of the substrate of the connector.

16. The method of forming the printed circuit board stack structure of claim 13, wherein the first printed circuit board further comprises a first device disposed on the bottom surface thereof, the first device is located within an annular region surrounded by an inner sidewall of the substrate of the connector, and/or wherein the second printed circuit board further comprises a second device disposed on the top surface thereof, the second device is located within the annular region.

17. The method of forming the printed circuit board stack structure of claim 13, wherein the connector further comprises a through via, located in the substrate and penetrating through the substrate to electrically connect the first conductive elastic piece to the second conductive elastic piece, wherein the first conductive elastic piece is in physical contact with a top surface of the through via and the first surface of the substrate, and the second conductive elastic piece is in physical contact with a bottom surface of the through via and the second surface of the substrate.

18. The method of forming the printed circuit board stack structure of claim 13, further comprising: after the locking, disassembling the detachable locking component to separate the first printed circuit board, the second printed circuit board and the connector.

19. The method of forming the printed circuit board stack structure of claim 18, further comprising: relocking the first printed circuit board, the second printed circuit board, and the connector together by the detachable locking component.

20. A method of forming a printed circuit board stack structure, comprising:
   providing a first printed circuit board and a second printed circuit board, wherein the first printed circuit board comprises a first pad disposed on a bottom surface of the first printed circuit board, the second printed circuit board comprises a second pad disposed on a top surface of the second printed circuit board;
   providing a connector, and placing the connector between the first printed circuit board and the second printed circuit board, the connector has an annular structure and comprises:
      a substrate, having a first surface and a second surface opposite to each other;
      a first conductive elastic piece, having a first fixed portion and a first free portion on the first surface;
      a second conductive elastic piece, having a second fixed portion and a second free portion on the second surface; and
      the first conductive elastic piece and the second conductive elastic piece are electrically connected to each other; and
   locking the first printed circuit board, the connector and the second printed circuit board together by a detachable locking component, such that the first conductive elastic piece is in electrical contact with the first pad, and the second conductive elastic piece is in electrical contact with the second pad,
   wherein an orthographic projection of the first printed circuit board and an orthographic projection of the connector on a horizontal plane at which the top surface of the second printed circuit board is located are within the second printed circuit board and overlapped with each other; and
   wherein the first surface of the substrate is facing the bottom surface of the first printed circuit board, and a first gap is existed between the first surface of the substrate and the bottom surface of the first printed circuit board, the second surface of the substrate is facing the top surface of the second printed circuit board, and a second gap is existed between the second surface of the substrate and the top surface of the second printed circuit board.

* * * * *